United States Patent
Zlotnik et al.

(10) Patent No.: US 11,733,274 B1
(45) Date of Patent: Aug. 22, 2023

(54) VOLTAGE SENSING CIRCUIT

(71) Applicant: Micron Technology, Inc., Boise, ID (US)

(72) Inventors: Leon Zlotnik, Camino, CA (US); Leonid Minz, Beer Sheva (IL); Ekram H. Bhuiyan, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/705,819

(22) Filed: Mar. 28, 2022

(51) Int. Cl.
*G01R 15/08* (2006.01)
*G01R 19/165* (2006.01)
*G01R 15/00* (2006.01)

(52) U.S. Cl.
CPC ..... *G01R 19/16557* (2013.01); *G01R 15/005* (2013.01); *G01R 15/08* (2013.01)

(58) Field of Classification Search
CPC .......... G06F 1/3296; G06F 1/324; G06F 1/26; G06F 1/3203; G06F 1/08; G06F 1/3206; G06F 13/4068; G06F 1/3237; G06F 2212/7201; G06F 11/3466; G06F 30/3312; G06F 30/36; G06F 11/2733; G06F 2212/1016; G01R 35/005; G01R 35/00; G01R 19/0092; G01R 19/0084; G01R 31/50; G01R 31/40; G01R 31/00; G01R 31/3004; G01R 31/26; G01R 31/3016; G01R 22/10; G01R 19/25; G01R 31/3842; G01R 31/2879; G01R 27/02; G01R 31/2644; G01R 19/16552; G01R 31/3167; G01R 31/303; G01R 31/2882; G01R 31/2829; G01R 22/00; G01R 23/16; G01R 31/318555; G01R 31/2853; G01R 19/16557; G01R 15/08; G01R 15/005

See application file for complete search history.

(56) References Cited

U.S. PATENT DOCUMENTS

| | | | |
|---|---|---|---|
| 3,430,070 A | 2/1969 | Marshall, Jr. et al. | |
| 5,179,295 A * | 1/1993 | Mattison | H03K 3/037 327/199 |
| 5,767,717 A * | 6/1998 | Schorn | H03K 3/356026 327/212 |
| 8,258,880 B2 * | 9/2012 | Koh | H03L 7/0995 331/34 |
| 9,599,672 B2 | 3/2017 | Abhishek et al. | |
| 2006/0294282 A1 | 12/2006 | Warner | |

* cited by examiner

*Primary Examiner* — Vinh P Nguyen
(74) *Attorney, Agent, or Firm* — Brooks, Cameron & Huebsch, PLLC

(57) ABSTRACT

A voltage sensing circuit includes voltage regulators, oscillator circuits, delay circuits, and a detector circuit. The detector circuit detects characteristics of signaling received from a first oscillator circuit and characteristics of signaling received from a second oscillator circuit. The detector circuit compares the detected characteristics of the signaling from the first oscillator circuit and the second oscillator circuit to determine whether the detected characteristics from the first oscillator circuit and the second oscillator circuit meet a particular criterion for providing voltage manipulation for the voltage sensing circuit.

22 Claims, 3 Drawing Sheets

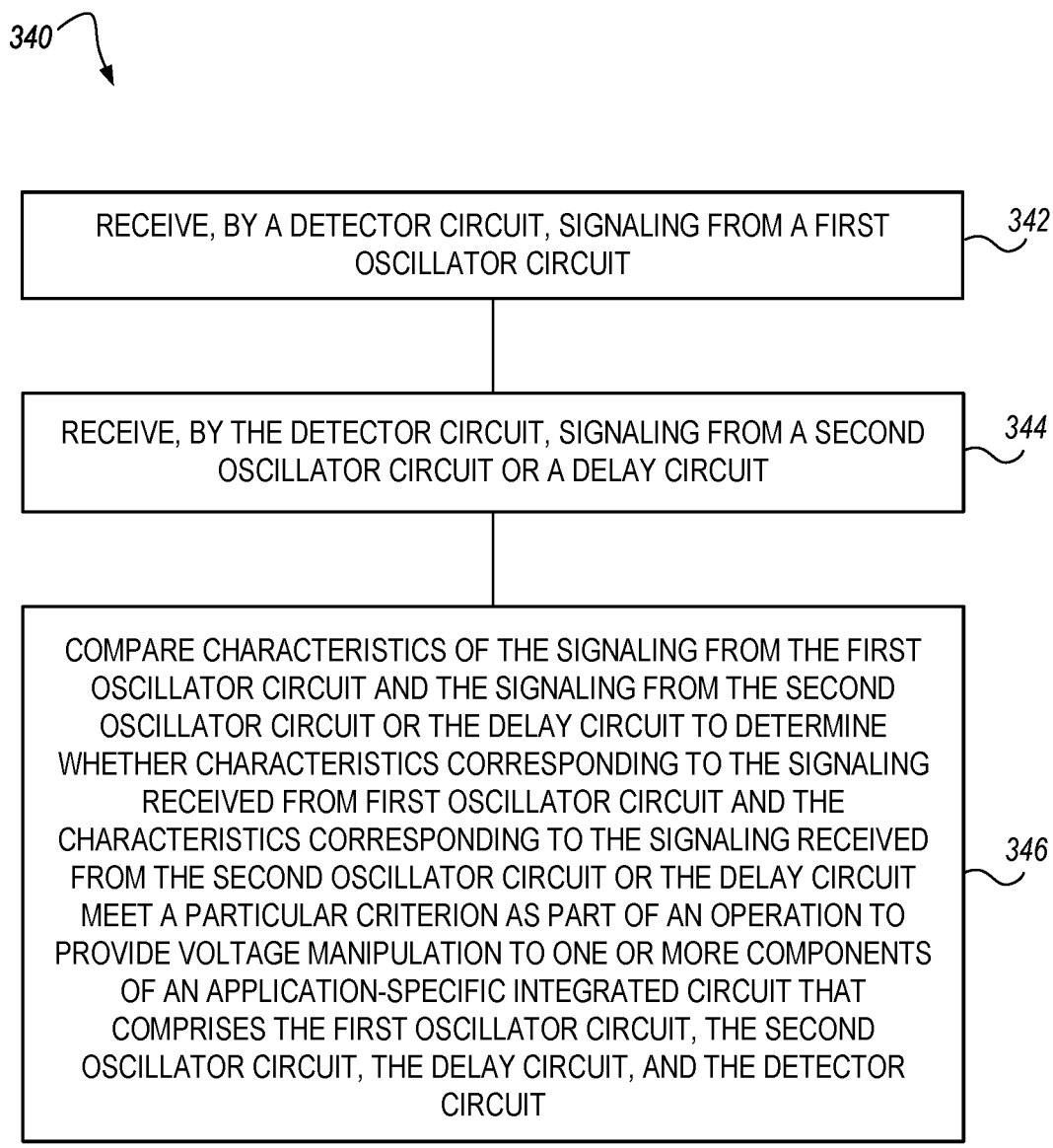

VOLTAGE SENSING CIRCUIT

TECHNICAL FIELD

Embodiments of the disclosure relate generally to digital logic circuits, and more specifically, relate to a voltage sensing circuit.

BACKGROUND

A memory system can include one or more digital circuits that can include various circuitry. In general, a portion of the circuitry can provide a voltage signal to power the digital circuits and/or to power components of the memory system.

BRIEF DESCRIPTION OF THE DRAWINGS

The present disclosure will be understood more fully from the detailed description given below and from the accompanying drawings of various embodiments of the disclosure.

FIG. 3 is a flow diagram corresponding to a method for a voltage sensing circuit in accordance with some embodiments of the present disclosure.

DETAILED DESCRIPTION

Figure 1:
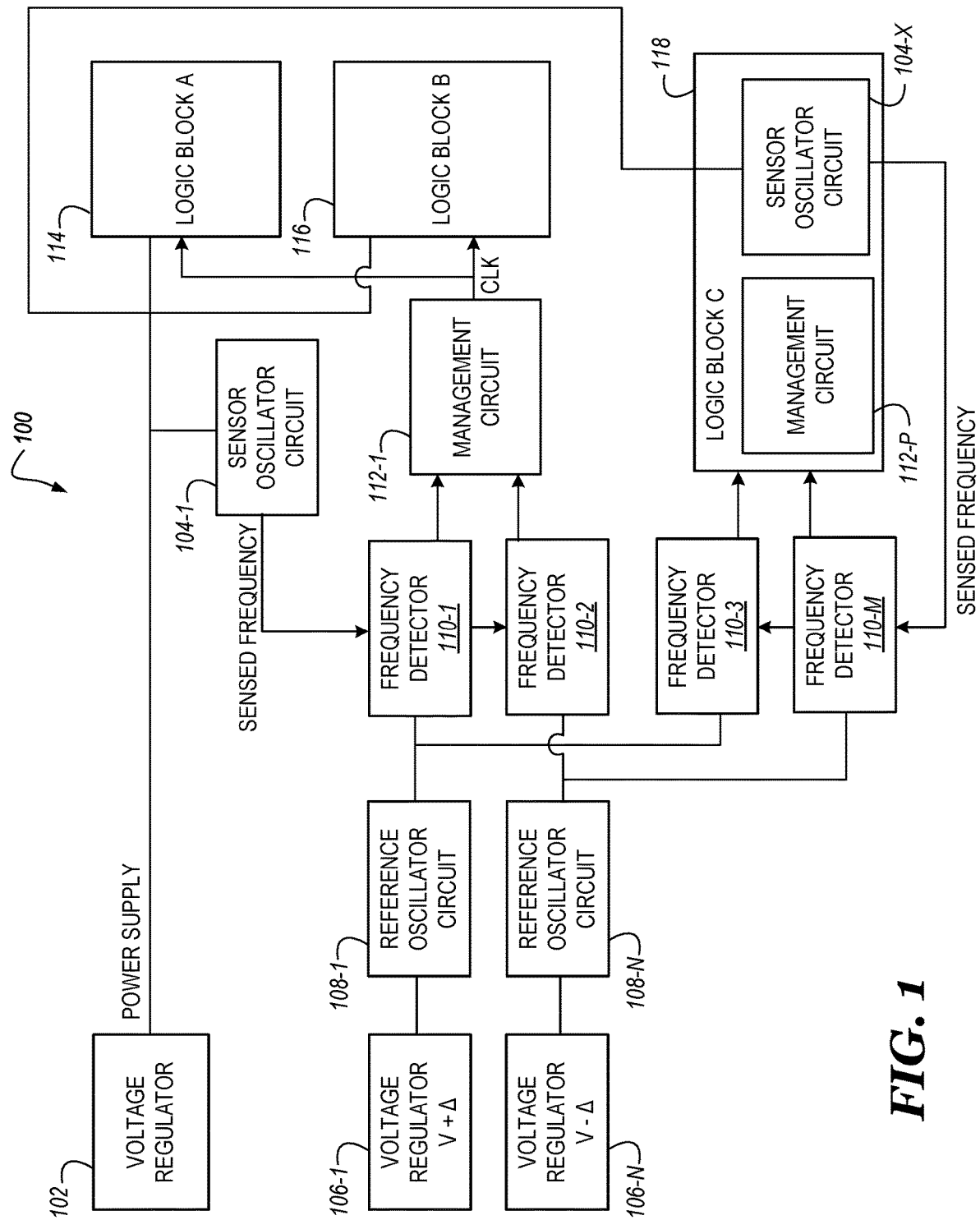
FIG. 1 illustrates an example system including a voltage sensing circuit in accordance with some embodiments of the present disclosure.

Aspects of the present disclosure are directed to a voltage sensing circuit. The voltage sensing circuit can determine an instantaneous voltage associated with a system (e.g., a System-on-Chip (SoC), application-specific integrated circuit (ASIC), field-programmable gate array (FPGA), or other hardware circuitry) in order to reduce power consumption and/or to improve performance in the system in comparison to approaches that do not employ such voltage sensing circuits. Accordingly, the voltage sensing circuit(s) described herein can provide benefits in systems that rely on instantaneous (or near-instantaneous) voltage sensing to track, limit, adjust, and/or manipulate power consumption and/or noise dynamically. Examples of voltage sensing circuit(s) and other components that can be utilized to facilitate embodiments of the present disclosure are described below in conjunction with FIG. 1, et alibi.

The voltage sensing circuit(s) described herein include various circuit components (e.g., voltage regulators, sensor circuits, delay circuits, detector circuits, etc.) that can allow for instantaneous voltages within the system to be determined. As described in more detail, herein, the voltage sensing circuit can include a first oscillator circuit (e.g., a free-running oscillator) that is powered from a rail of a voltage regulator (e.g., a rail of a voltage regulator that is local to the system and/or provides a measured voltage that may or may not be coupled to a main power supply of a system associated with the voltage sensing circuit(s)). In this orientation, the oscillator circuit can serve as a voltage sensor that is part of the voltage sensing circuitry. The voltage sensing circuit can further include a second oscillator circuit (e.g., a reference oscillator or delay circuit) that is powered from a separate voltage supply (e.g., a voltage regulator that provides a stable voltage that is characterized by low noise and/or low voltage fluctuation, such as a threshold voltage to a system associated with the voltage sensing circuit(s)).

As described in more detail, herein, frequency differences between the oscillator circuits can be compared to determine an instantaneous sense voltage value that corresponds to the actual sensed voltage at a particular moment in time of the system associated with the voltage sensing circuit(s). In addition, a phase difference between one of the oscillator circuits and a delay circuit can be compared to determine an instantaneous sense voltage value that corresponds to the actual sensed voltage at a particular moment in time of the system associated with the voltage sensing circuit(s). In the case of compared frequencies, a difference in the compared frequencies indicates that oscillators are subjected to differing voltages, while in the case of the phase associated with a signal from the oscillator being compared to the delay circuit, a phase difference may be detected with the oscillator and the delay circuit are subjected to differing voltage. By allowing for instantaneous (or near-instantaneous) voltage sensing using the voltage sensing circuit(s) described herein, electrical signals, such as voltages, within the system can be tracked, limited, adjusted, and/or manipulated to dynamically alter power consumption and/or noise in the system, and, in particular in automated power management systems.

In addition, embodiments herein allow for a threshold voltage to be set for use by the voltage sensing circuit and/or components coupled thereto. For example, a magnitude of a voltage signal generated by one or more voltage regulators can be set as a threshold voltage for use by the voltage sensing circuit and/or components coupled thereto. By comparing various parameters (e.g., frequencies, phase shifts, etc.) that are determined by the components described herein (e.g., by the detectors circuits), it is possible to determine whether a current operational voltage is greater than or less than the threshold voltage. Using this information, it is possible to alter the threshold voltage and/or the operational voltage to a higher or lower voltage in order to manipulate dynamic power consumption and/or noise in a system such as an automated power management system.

In general, an oscillator is an electronic circuit that produces a periodic, oscillating electronic signal, often a sine wave, a square wave, or triangle wave. An oscillator can be used to convert direct current (DC) from a voltage supply or a power supply to an alternating current (AC) signal. An oscillator can be a "free-running" oscillator (i.e., an oscillator that operates in the absence of a clock signal) or a "reference" oscillator (i.e., an oscillator that can be used to derive or generate a time reference and/or a frequency reference for other components of a system).

FIG. 1 illustrates an example system including a voltage sensing circuit 100 in accordance with some embodiments of the present disclosure. The example system, which can be referred to in the alternative as an "apparatus," includes a voltage regulator 102 (e.g., a "first voltage regulator") that is configured to generate and apply a power supply signal (e.g., a supply voltage signal) to a sensor oscillator circuit 104-1 (e.g., a "first sensor oscillator circuit"). As shown in FIG. 1, the voltage regulator 102 is further configured to generate and apply the power supply signal to one or more logic blocks (i.e., the logic block A 114, the logic block B 116, and/or the logic block C 118).

The voltage sensing circuit 100 can further include voltage regulators 106-1 to 106-N, which can be coupled to the reference oscillator circuits 108-1 to 108-N. The reference oscillator circuits 108-1 to 108-N can be coupled to respective frequency detectors 110-1 to 110-2, which are coupled to a management circuit 112-1. As shown in FIG. 1, the management circuit 112-1 can be a clock management circuit that provides timing signals (e.g., the "CLK" signal) to the logic block A 114 and/or to the logic block B 116; however, embodiments are not so limited, and in some embodiments, the management circuit 112-1 can be a power management circuit that provides power signals (e.g., regulated, altered, and/or modulated power signals) to the logic block A 114 and/or to the logic block B 116, and/or a voltage management circuit that provides voltage signals (e.g., regulated, altered, and/or modulated voltage signals) to the logic block A 114 and/or to the logic block B 116, and/or to other components that may be coupled to the voltage sensing circuit 100.

The reference oscillator circuits 108-1 to 108-N can further be coupled to additional frequency detectors, such as the frequency detectors 110-3 to 110-M. The frequency detectors 110-3 to 110-M can be coupled to the logic block C 118, which, as shown in FIG. 1, includes clock management circuitry 112-P and sensor oscillator circuit 104-X. In the portion of the voltage sensing circuit 100 that includes the logic block C 118, the sensor oscillator circuit 104-X can be configured to transfer a sensed frequency signal to the frequency detectors 110-3 to 110-M.

In some embodiments, the sensor oscillator circuit 104-1 (and/or the sensor oscillator circuit 104-X) can be a free-running oscillator that is configured to convert the power supply signal received from the voltage regulator into an alternating current signal (or a "sensed frequency") and transfer the sensed frequency to the frequency detector 110-1 (or to the frequency detector 110-M in the case of the sensor oscillator circuit 104-X).

The reference oscillator circuits 108-1 to 108-N can be "reference" oscillators (i.e., oscillators that can be used to derive or generate a time reference and/or a frequency reference for other components of a system) and can be configured to receive a voltage signal from the voltage regulator 106-1 and the voltage regulator 106-N, respectively. The voltage regulators 106-1 to 106-N can generate a measured (e.g., known) voltage and transfer a voltage signal corresponding to the measured voltage to the reference oscillators 108-1 to 108-N, respectively. The reference oscillators 108-1 to 108-N can then generate and output a reference frequency.

In the embodiment shown in FIG. 1, the frequency detector 110-1 can receive the sensed frequency from the sensor oscillator circuit 104-1 and the reference frequency from the reference oscillator 108-1 and compare characteristics of the frequency of the sensed frequency and the reference frequency to determine if the sensed frequency and the reference frequency are the same or are different. Depending on whether the sensed frequency and the reference frequency are the same or are different, the voltage sensing circuit 100 can take an action (or cause an action to be taken) to track, limit, adjust or manipulate the dynamic power available to the voltage sensing circuit 100 to provide voltage manipulation (e.g., voltage drop compensation, voltage spike compensation, etc.) to the components thereof, or to components externally coupled to the voltage sensing circuit 100. In some embodiments, the action can include altering a clocking speed of, for example, one or more of the management circuits 112-1 to 112-P to limit, adjust or manipulate the dynamic power available to the voltage sensing circuit 100. As mentioned above, however, embodiments are not so limited and, in some embodiments, the management circuits 112-1 to 112-P can take an action to alter a power signal and/or a voltage signal to limit, adjust or manipulate the dynamic power available to the voltage sensing circuit 100.

The logic block A 114, the logic block B 116, and/or the logic block C 118 can include various hardware that form one or more cores (e.g., "intellectual property (IP) cores"). As used herein, a "core" or "IP core" generally refers to one or more blocks of data and/or logic that form constituent components of an application-specific integrated circuit or field-programmable gate array. The logic block A 114, the logic block B 116, and/or the logic block C 118 can be designed, built, and/or otherwise configured to perform specific tasks and/or functions within the systems described herein. In some embodiments, the voltage sensing circuit 100 can take an action (or cause an action to be taken) to track, limit, adjust or manipulate the dynamic power available to the voltage sensing circuit 100 to provide voltage manipulation to the logic block A 114, the logic block B 116, and/or the logic block C 118.

In a non-limiting example, an apparatus (e.g., the voltage sensing circuit 100) includes a first voltage regulator 102 coupled to a first oscillator circuit 104 and a second voltage regulator 106 coupled to a second oscillator circuit 108. A detector circuit (e.g., the frequency detector circuit 110 and/or the phase detector circuit 211 of FIG. 2) is coupled to the first oscillator circuit 104 and the second oscillator circuit 108.

The detector circuit can detect characteristics of signaling received from the first oscillator circuit 104 and detect characteristics of signaling from the second oscillator circuit 108. The detector circuit can then compare the detected characteristics of the signaling from the first oscillator circuit 104 and the detected characteristics of the signaling from the second oscillator circuit 108 to determine whether the detected characteristics from the first oscillator circuit 104 and the detected characteristics from the second oscillator circuit 108 meet a particular criterion as part of an operation to provide voltage manipulation to one or more components of the apparatus.

In some embodiments, the detected characteristics can include a frequency (e.g., a frequency of a waveform corresponding to the signaling) and/or a phase (e.g., a phase of a waveform corresponding to the signaling). That is, in some embodiments, the characteristics of the signaling from the first oscillator circuit 104 and the characteristics of the signaling from the second oscillator circuit 108 comprise a frequency associated with the signaling from the first oscillator circuit 104 and a frequency associated with the signaling from the second oscillator circuit 108. Embodiments are not so limited, however, and in some embodiments, the characteristics of the signaling from the first oscillator circuit 104 and the characteristics of the signaling from the second oscillator circuit 108 comprise a phase associated with the signaling from the first oscillator circuit 104 and a phase associated with the signaling from the second oscillator circuit 108.

As described above, the first voltage regulator 102 can be a voltage regulator that generates and supplies a power supply signal (e.g., a supply voltage signal) to various components of the apparatus, while the second voltage regulator 106 can generate a measured (e.g., known) reference voltage signal. In some embodiments, the second voltage regulator 108 can be configured to generate a voltage signal that is offset by a factor from a threshold voltage signal, as described in more detail in connection with FIG. 2, herein.

In some embodiments, the first voltage regulator 102, the first oscillator circuit 104, the second voltage regulator 106, the second oscillator circuit 108, and the detector circuit 110 are resident on an application-specific integrated circuit. As used herein, the term "resident on" refers to something that is physically located on a particular component. For example, the first voltage regulator 102, the first oscillator circuit 104, the second voltage regulator 106, the second oscillator circuit 108, and the detector circuit 110 being "resident on" the apparatus (e.g., an ASIC, FPGA, etc.) refers to a condition in which the hardware circuitry that comprises the first voltage regulator 102, the first oscillator circuit 104, the second voltage regulator 106, the second oscillator circuit 108, and the detector circuit 110 is physically located on the apparatus. The term "resident on" may be used interchangeably with other terms such as "deployed on" or "located on," herein.

In such embodiments, the apparatus can include a plurality of logic blocks (e.g., the logic block A 114, the logic block B 116, and/or the logic block C 118) can be configured to receive signaling based on whether the detected characteristics from first oscillator circuit 104 the detected characteristics from the second oscillator circuit 108 meet the particular criterion. In general, the term "particular criterion," as used herein refers to one or more criteria in which the detected and/or determined characteristics of the signaling associated with the signaling from the first oscillator circuit 104 and/or the signaling from the second oscillator circuit 108 are substantially the same and/or substantially equal. As used herein, the term "substantially" intends that the characteristic need not be absolute, but is close enough so as to achieve the advantages of the characteristic. For example, "substantially the same" or "substantially equal" are not limited to a condition in which the characteristics of the signals are absolutely the same or absolutely equal but are the same and/or equal within manufacturing limitations, operational conditions, etc. to achieve the characteristics of being "the same" or "equal." For example, minor discrepancies in the characteristics of the signaling may lead to a scenario in which the characteristics are not absolutely the same or equal, but are substantially equal such that components of the apparatus function as if said characteristics are the same or equal. It is further contemplated, however, that such characteristics may be exactly the same or exactly equal given the context of the disclosure.

As described in more detail herein, when the "particular criterion" is met, the voltage sensing circuit 100 can cause performance of operations to track, limit, adjust, and/or manipulate power consumption and/or noise in a system such as an automated power management system, in which the voltage sensing circuit 100 is deployed. For example, the voltage sensing circuit 100 can cause performance of operations to to alter a power signal and/or a voltage signal to dynamically or otherwise limit, adjust, or manipulate the voltage, current, and/or power, among other signaling parameters, available to the voltage sensing circuit 100 and/or to components external to the voltage sensing circuit 100. However, embodiments of the present disclosure contemplate scenarios in which such operations may be performed when the "particular criterion" is either not met or is exceeded. For example, embodiments herein allow for performance of operations to track, limit, adjust, and/or manipulate power consumption and/or noise in a system in response to the "particular criterion" being exceeded or not being met.

In some embodiments, the voltage sensing circuit 100 can be deployed on, or otherwise included in a memory system (e.g., a storage device, a memory module, or a hybrid of a storage device and memory module). Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs)

In other embodiments, the voltage sensing circuit 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Such computing devices can include a host system that is coupled to a memory system (e.g., one or more storage devices, memory modules, or a hybrid of a storage device and memory module). A host system can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system uses the storage device, the memory module, or a hybrid of the storage device and the memory module, for example, to write data to the storage device, the memory module, or the hybrid of a storage device and memory module and read data from the storage device, the memory module, or the hybrid of a storage device and memory module.

In these examples, the host system can include a processing unit such as a central processing unit (CPU) that is configured to execute an operating system. In some embodiments, the processing unit can execute a complex instruction set computer architecture, such an x86 or other architecture suitable for use as a CPU for a host system.

A host system can be coupled to a memory system via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system and the memory system. The host system can further utilize an NVM Express (NVMe) interface to access components when the memory system is coupled with the host system by the PCIe interface. The physical host interface can provide an interface for passing control, address, data, and other signals between the memory system and the host system. In general, the host system can access multiple memory sub-systems via a same communication connection, multiple separate communication connections, and/or a combination of communication connections.

A memory system can include any combination of the different types of non-volatile memory devices and/or volatile memory devices. The volatile memory devices can be, but are not limited to, random access memory (RAM), such as dynamic random-access memory (DRAM) and synchronous dynamic random access memory (SDRAM).

Some examples of non-volatile memory devices include negative—and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as three-dimensional cross-point arrays of non-volatile memory cells and NAND type memory (e.g., 2D NAND, 3D NAND) are described, the memory device can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory system can also include additional circuitry or components. In some embodiments, a memory system can include a cache or buffer (e.g., DRAM) and address circuitry (e.g., a row decoder and a column decoder) that can receive an address from the memory system controller and decode the address to access the memory device(s).

In some embodiments, memory devices can include local media controllers that operate in conjunction with a memory system controller to execute operations on one or more memory cells of the memory devices. For example, an external controller can externally manage the memory device (e.g., perform media management operations on the memory device). In some embodiments, a memory device is a managed memory device, which is a raw memory device combined with a local controller for media management within the same memory device package. An example of a managed memory device is a managed NAND (MNAND) device.

Figure 2:
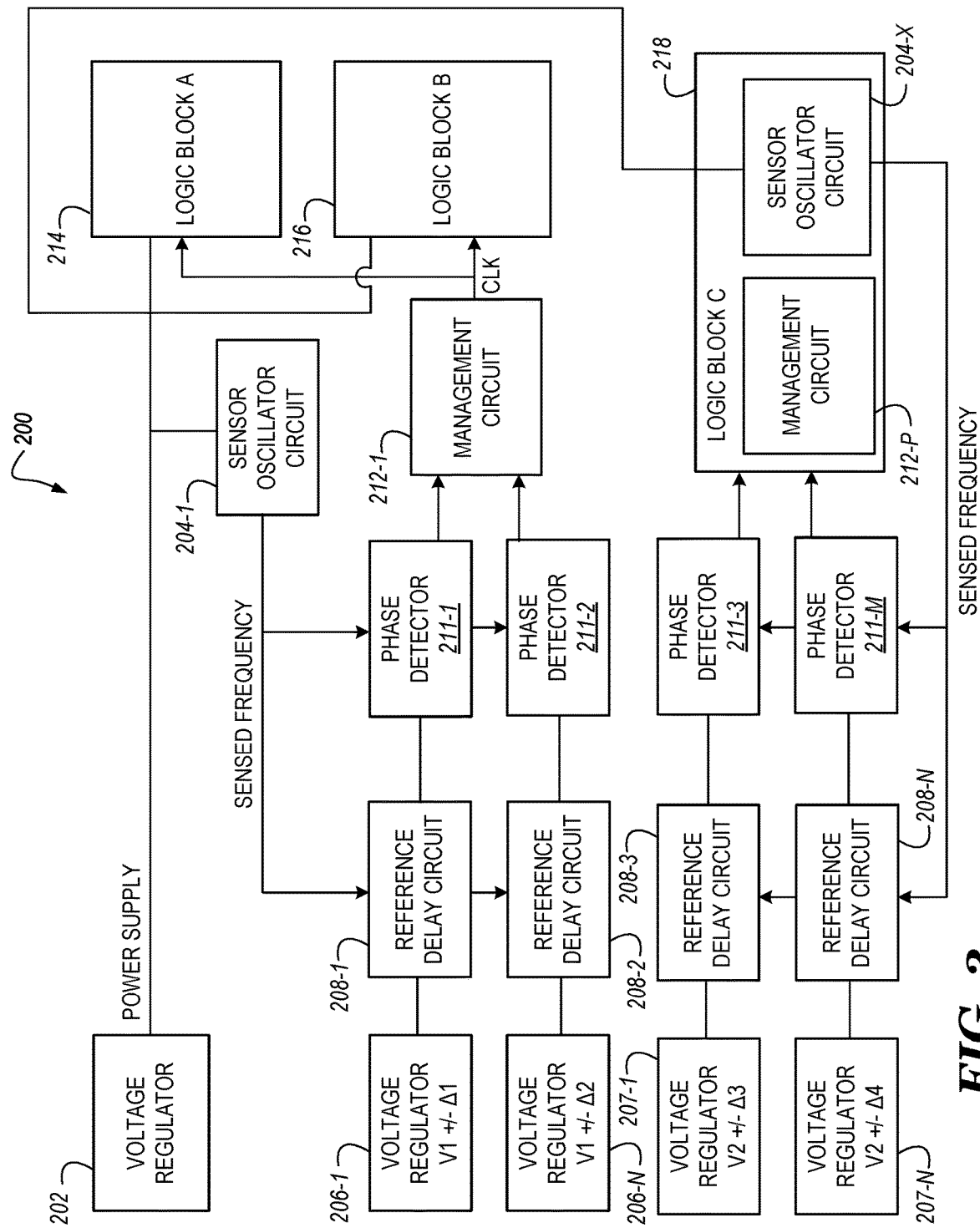
FIG. 2 illustrates another example system including a voltage sensing circuit in accordance with some embodiments of the present disclosure.

FIG. 2 illustrates another example system including a voltage sensing circuit 200 in accordance with some embodiments of the present disclosure. The voltage sensing circuit 200 can be analogous to the voltage sensing circuit 100 illustrated in FIG. 1. The example voltage sensing circuit 200, which can be referred to in the alternative as a "system" or an "apparatus," includes a voltage regulator 202, sensor oscillator circuits 204-1 to 204-X, voltage regulators 206-1 to 206-N and 207-1 to 207-N, management circuits 212-1 to 212-P, a logic block A 214, a logic block B 216, and a logic block 218, which can be analogous to the voltage regulator 102, the sensor oscillator circuits 104-1 to 104-X, the voltage regulators 106-1 to 106-N, the management circuits 112-1 to 112-P, the logic block A 114, the logic block B 116, and the logic block 118 of FIG. 1, respectively.

The voltage sensing circuit 200 of FIG. 2 further includes reference delay circuits 208-1 to 208-N, which are coupled to respective voltage regulators 206-1 to 206-N. The voltage regulators 206-1 to 206-N can be configured to alter a received voltage by a particular offset ("delta") value as shown in FIG. 2. For example, the voltage regulator 206-1 can be configured to receive a first (known) voltage "V1" signal and increment or decrement the magnitude of the received voltage signal by a particular offset value or "factor" (e.g., $+/-\Delta 1$). The voltage regulators 206-2, 206-3, to 206-N can, as shown in FIG. 2, be configured to receive a same or different voltage signal (e.g., V1 or V2, etc.) and apply a different offset (e.g., $+/-\Delta 2$, $+/-\Delta 3$, $+/-\Delta 4$, etc.).

The voltage signals can be received by respective reference delay circuits 208-1 to 208-N. In general, the reference delay circuits 208-1 to 208-N are hardware circuit electronic simulation devices for reproduction of a signal with a delay equal to a predetermined time interval. The reference delay circuits 208-1 to 208-N can be used for simulation of technological possesses associated with channeling of power and/or as components of automatic control and monitoring systems.

In the embodiment shown in FIG. 2, the voltage sensing circuit 200 includes phase detectors 211-1 to 211-M, which can receive a signal having a known or predetermined delay from the reference delay circuits 208-1 to 208-N. The phase detectors 211-1 to 211-M can compare characteristics of the phase of the sensed frequency and a frequency having a known or predetermined delay to determine if a phase of a signal associated with the sensed frequency and a phase of a signal associated with the reference (e.g., delayed) frequency are the same or are different. Depending on whether the phase of the sensed frequency and the phase of the reference frequency are the same or are different, the voltage sensing circuit 200 can take an action (or cause an action to be taken) to track, limit, adjust or manipulate the dynamic power available to the voltage sensing circuit 200 to provide voltage manipulation to the components thereof, or to components externally coupled to the voltage sensing circuit 200. In some embodiments, the action can include altering a clocking speed of, for example, one or more of the clock management circuits 212-1 to 212-P to limit, adjust or manipulate the dynamic power available to the voltage sensing circuit 200. As mentioned above, however, embodiments are not so limited and, in some embodiments, the management circuits 212-1 to 212-P can take an action to alter a power signal and/or a voltage signal to dynamically or otherwise limit, adjust or manipulate the voltage, current, and/or power, among other signaling parameters, available to the voltage sensing circuit 200.

Although FIG. 2 illustrates and embodiment in which the reference delay circuits 208-1 to 208-N act as a reference circuit, embodiments herein contemplate scenarios in which the reference delay circuits 208-1 to 208-N can operate as sensing circuits analogous to the sensor oscillator circuits 204-1 to 204-X. In such embodiments, the sensor oscillator circuits 204-1 to 204-X can essentially be swapped with the reference delay circuits 208-1 to 208-N to perform the operations described herein.

In a non-limiting example, an apparatus (e.g., the voltage sensing circuit 200) includes a first voltage regulator 202 coupled to a first oscillator circuit 204 and a second voltage regulator 206 coupled to a reference delay circuit 208 and management circuitry 212-1 to 212-P. A detector circuit (e.g., the frequency detector circuit 110 of FIG. 1 and/or the phase detector circuit 211) is coupled to the management circuitry 212-1 to 212-P. As described herein, the first voltage regulator 202 can provide a supply voltage signal, and the second voltage regulator 206 can provide a measured voltage signal. As described above, the second voltage regulator 206 can be configured to generate a voltage signal that is offset by a factor from a threshold voltage signal generated by, or received by, the second voltage regulator 206.

The detector circuit can be configured to receive signaling from the first oscillator circuit 204, receive signaling from the reference delay circuit 208, and compare characteristics of the signaling from the first oscillator circuit 204 and the signaling from the reference delay circuit 208 to determine whether characteristics corresponding to the signaling received from first oscillator circuit 204 and the characteristics corresponding to the signaling received from the second oscillator circuit 208 meet a particular criterion as part of an operation to provide voltage manipulation to one or more components of the apparatus.

Continuing with this non-limiting example, the detector circuit can further provide signaling corresponding to the compared characteristics corresponding to the signaling received from first oscillator circuit 204 and the characteristics corresponding to the signaling received from the reference delay circuit 208 to the management circuitry 212-1 to 212-P. For example, the detector circuit can provide signaling to the management circuitry 212-1 to 212-P that is indicative of a power consumption (or predicted power consumption) of components of the apparatus based, at least in part, on the compared characteristics corresponding to the signaling received from first oscillator circuit 204 and the characteristics corresponding to the signaling received from the reference delay circuit 208.

As mentioned above, in some embodiments, the characteristics corresponding to the signaling received from first oscillator circuit 204 and the characteristics corresponding to the signaling received from the reference delay circuit 208 meet the particular criterion when a frequency associated with the signaling from the first oscillator circuit 204 and a frequency associated with the signaling from the reference delay circuit 208 are equal (or substantially equal). Similarly, in some embodiments, the characteristics corresponding to the signaling received from first oscillator circuit 204 and the characteristics corresponding to the signaling received from the second oscillator circuit 208 meet the particular criterion when a phase associated with the signaling from the first oscillator circuit 204 and a phase associated with the signaling from the reference delay circuit 208 are equal (or substantially equal).

In some embodiments, the first voltage regulator 202, the first oscillator circuit 204, the second voltage regulator 206, the reference delay circuit 208, the detector circuit 211, and the clock management circuitry 212 are resident on an application-specific integrated circuit. In such embodiments, the apparatus can further include a plurality of logic blocks (e.g., the logic block A 214, the logic block B 216, and/or the logic block 218) can be configured to receive signaling from the management circuitry 212-1 to 212-P corresponding to the signaling corresponding to the compared characteristics corresponding to the signaling received from first oscillator circuit 204 and the characteristics corresponding to the signaling received from the reference delay circuit 208.

FIG. 3 is a flow diagram corresponding to a method 340 for a voltage sensing circuit in accordance with some embodiments of the present disclosure. The method 340 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 340 is performed by one or more components of the voltage sensing circuit 100 of FIG. 1 and/or one or more components of the voltage sensing circuit 200 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 342, a detector circuit can receive signaling from a first oscillator circuit. The detector circuit can be analogous to the frequency detector circuit 110 of FIG. 1 and/or the phase detector circuit 211 of FIG. 2. The first oscillator circuit can be analogous to the sensor oscillator circuit(s) 104-1 to 104-X of FIG. 1 and/or the sensor oscillator circuit(s) 204-1 to 204-X of FIG. 2, herein.

At operation 344, the detector circuit can receive signaling from a second oscillator circuit or a delay circuit. The second oscillator circuit can be analogous to the reference oscillator circuit(s) 108-1 to 108-N of FIG. 1 and the delay circuit can be analogous to the reference delay circuit(s) 208-1 to 204-N of FIG. 2, herein. In some embodiments, the method 340 can include receiving, by the first oscillator circuit, a voltage signal from a first voltage regulator that corresponds to signaling generated by the first oscillator circuit and receiving, by the second oscillator circuit, a voltage signal from a second voltage regulator that corresponds to signaling generated by the second oscillator circuit or a delay signal that corresponds to the signaling generated by the reference delay circuit 208-1 to 208-N.

In some embodiments, the method 340 can include determining, by the detector circuit that the characteristics corresponding to the signaling received from the first oscillator circuit and the characteristics corresponding to the signaling received from the second oscillator circuit meet the particular criterion when a phase associated with the signaling from the first oscillator circuit and a phase associated with the signaling from the reference delay circuit are equal (or substantially equal). Embodiments are not so limited, however, and in some embodiments, the method 340 can include determining, by the detector circuit that the characteristics corresponding to the signaling received from the first oscillator circuit and the characteristics corresponding to the signaling received from the second oscillator circuit meet the criterion when a frequency associated with the signaling from the first oscillator circuit and a frequency associated with the signaling from the second oscillator circuit are equal (or substantially equal).

At operation 346, characteristics of the signaling from the first oscillator circuit and the signaling from the second oscillator circuit and/or the reference delay circuit are compared by, for example, the detector circuit, to determine whether characteristics corresponding to the signaling received from first oscillator circuit and the characteristics corresponding to the signaling received from the second oscillator circuit and/or the signaling received from the reference delay circuit meet a particular criterion as part of an operation to provide voltage manipulation to one or more components of an application-specific integrated circuit (ASIC) and/or components external to the ASIC that comprises the first oscillator circuit, the second oscillator circuit, the delay circuit, and the detector circuit. Some non-limiting examples of components of the ASIC can include logic blocks, such as the logic blocks 114, 116, and/or 118 of FIG. 1 and/or the logic blocks 214, 216, and/or 218 of FIG. 2. Other non-limiting examples of components of the ASIC and/or components external to the ASIC can include memory devices, graphics processing units, controllers, and/or processing devices, among others, that are generally deployed in a computer in which the ASIC and/or voltage sensing circuit described herein reside.

In some embodiments, the method 340 can include transferring signaling corresponding to the compared characteristics of the signaling received from first oscillator circuit and the characteristics of the signaling received from the second oscillator circuit and/or the reference delay circuit to management circuitry coupled to the detector circuit. The management circuitry can be analogous to the clock management circuitry 112-1 to 112-P of FIG. 1 and/or the management circuitry 212-1 to 212-P of FIG. 2, herein. The method 340 can further include applying a signal (e.g., a clock signal, a power signal, a voltage signal, etc.) to one or more logic blocks (e.g., the logic block A 114, the logic block B 116, and/or the logic block C 118 of FIG. 1 and/or the logic block A 214, the logic block B 216, and/or the logic block C 218 of FIG. 2) coupled to the management circuitry based on the transferred signaling corresponding to the compared characteristics of the signaling received from first oscillator circuit and the characteristics of the signaling received from the second oscillator circuit.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
 a first voltage regulator coupled to a first oscillator circuit;
 a second voltage regulator coupled a second oscillator circuit or a delay circuit; and
 a detector circuit coupled to the first oscillator circuit and the second oscillator circuit or the delay circuit, wherein the detector circuit is configured to:
  detect characteristics of signaling received from the first oscillator circuit;
  detect characteristics of signaling from the second oscillator circuit or the delay circuit; and
  compare the detected characteristics of the signaling from the first oscillator circuit and the detected characteristics of the signaling from the second oscillator circuit or the delay circuit to determine whether the detected characteristics from the first oscillator circuit and the detected characteristics from the second oscillator circuit or the delay circuit meet a particular criterion for providing voltage manipulation to one or more components of the apparatus.

2. The apparatus of claim 1, wherein the first voltage regulator provides a supply voltage signal, and wherein the second voltage regulator provides measured voltage signal.

3. The apparatus of claim 1, wherein the characteristics of the signaling from the first oscillator circuit and the characteristics of the signaling from the second oscillator circuit comprise a frequency associated with the signaling from the first oscillator circuit and a frequency associated with the signaling from the second oscillator circuit.

4. The apparatus of claim 1, wherein the characteristics of the signaling from the first oscillator circuit and the characteristics of the signaling from the delay circuit comprise a phase associated with the signaling from the first oscillator circuit and a phase associated with the signaling from the second oscillator circuit.

5. The apparatus of claim 1, wherein the second voltage regulator is configured to generate a voltage signal that is offset by a factor from a threshold voltage signal.

6. The apparatus of claim 1, wherein the first voltage regulator, the first oscillator circuit, the second voltage regulator, the second oscillator circuit, and the detector circuit are resident on an application-specific integrated circuit.

7. The apparatus of claim 1, further comprising a plurality of logic blocks configured to receive signaling based on whether the detected characteristics from first oscillator circuit the detected characteristics from the second oscillator circuit meet the particular criterion.

8. An apparatus, comprising:
a first voltage regulator coupled to a first oscillator circuit;
a second voltage regulator coupled a second oscillator circuit or a delay circuit;
management circuitry; and
a detector circuit coupled to the management circuitry and configured to:
  receive signaling from the first oscillator circuit;
  receive signaling from the second oscillator circuit or the delay circuit;
  compare characteristics of the signaling from the first oscillator circuit and the signaling from the second oscillator circuit to determine whether characteristics corresponding to the signaling received from the first oscillator circuit and the characteristics corresponding to the signaling received from the second oscillator circuit or the delay circuit meet a particular criterion as part of an operation to provide voltage manipulation to one or more components of the apparatus; and
  provide signaling corresponding to the compared characteristics corresponding to the signaling received from the first oscillator circuit and the characteristics corresponding to the signaling received from the second oscillator circuit or the delay circuit to the management circuitry.

9. The apparatus of claim 8, wherein the characteristics corresponding to the signaling received from the first oscillator circuit and the characteristics corresponding to the signaling received from the second oscillator circuit meet the particular criterion when a frequency associated with the signaling from the first oscillator circuit and a frequency associated with the signaling from the second oscillator circuit are equal.

10. The apparatus of claim 8, wherein the characteristics corresponding to the signaling received from the first oscillator circuit and the characteristics corresponding to the signaling received from the delay circuit meet the particular criterion when a phase associated with the signaling from the first oscillator circuit and a phase associated with the signaling from the delay circuit are equal.

11. The apparatus of claim 8, wherein the first voltage regulator, the first oscillator circuit, the second voltage regulator, the second oscillator circuit, the detector circuit, and the management circuitry are resident on an application-specific integrated circuit.

12. The apparatus of claim 8, further comprising a plurality of logic blocks configured to receive signaling from the management circuitry corresponding to the signaling corresponding to the compared characteristics corresponding to the signaling received from the first oscillator circuit and the characteristics corresponding to the signaling received from the second oscillator circuit.

13. The apparatus of claim 8, wherein the second voltage regulator is configured to generate a voltage signal that is offset by a factor from a threshold voltage signal generated by the second voltage regulator.

14. The apparatus of claim 8, wherein the first voltage regulator provides a supply voltage signal, and wherein the second voltage regulator provides a measured voltage signal.

15. The apparatus of claim 8, wherein the management circuitry comprises clock management circuitry, power management circuitry, or voltage management circuitry, or any combination thereof.

16. A method, comprising:
receiving, by a detector circuit, signaling from a first oscillator circuit;
receiving, by the detector circuit, signaling from a second oscillator circuit or a delay circuit;
comparing characteristics of the signaling from the first oscillator circuit and the signaling from the second oscillator circuit or the delay circuit to determine whether characteristics corresponding to the signaling received from a first oscillator circuit and the characteristics corresponding to the signaling received from the second oscillator circuit or the delay circuit meet a particular criterion as part of an operation to provide voltage manipulation to one or more components of an application-specific integrated circuit that comprises the first oscillator circuit, the second oscillator circuit or the delay circuit, and the detector circuit.

17. The method of claim 16, further comprising transferring signaling corresponding to the compared characteristics of the signaling received from the first oscillator circuit and the characteristics of the signaling received from the second oscillator circuit or the delay circuit to management circuitry coupled to the detector circuit.

18. The method of claim 17, further comprising applying a signal to one or more logic blocks coupled to the management circuitry based on the transferred signaling corresponding to the compared characteristics of the signaling received from the first oscillator circuit and the characteristics of the signaling received from the second oscillator circuit or the delay circuit.

19. The method of claim 16, further comprising:
receiving, by the first oscillator circuit, a voltage signal from a first voltage regulator that corresponds to signaling generated by the first oscillator circuit; and
receiving, by the second oscillator circuit, a voltage signal from a second voltage regulator that corresponds to signaling generated by the second oscillator circuit.

20. The method of claim 16, further comprising:
receiving, by the first oscillator circuit, a voltage signal from a first voltage regulator that corresponds to signaling generated by the first oscillator circuit; and receiving, by the delay circuit, a voltage signal from a second voltage regulator that corresponds to signaling generated by the delay circuit.

21. The method of claim 16, further comprising determining, by the detector circuit that the characteristics corresponding to the signaling received from the first oscillator circuit and the characteristics corresponding to the signaling received from the delay circuit meet the particular criterion when a phase associated with the signaling from the first oscillator circuit and a phase associated with the signaling from the second oscillator circuit are equal.

22. The method of claim 16, further comprising determining, by the detector circuit that the characteristics corresponding to the signaling received from the first oscillator circuit and the characteristics corresponding to the signaling received from the second oscillator circuit meet the criterion when a frequency associated with the signaling from the first oscillator circuit and a frequency associated with the signaling from the second oscillator circuit are equal.

* * * * *